United States Patent [19]

Meyer, IV et al.

[11] Patent Number: 5,549,155
[45] Date of Patent: Aug. 27, 1996

[54] INTEGRATED CIRCUIT COOLING APPARATUS

[75] Inventors: George A. Meyer, IV, Conestoga; Jerome E. Toth, Hatboro; Richard W. Longsderff, Lancaster, all of Pa.

[73] Assignee: Thermacore, Inc., Lancaster, Pa.

[21] Appl. No.: 424,791

[22] Filed: Apr. 18, 1995

[51] Int. Cl.⁶ .................................................. F28D 15/00
[52] U.S. Cl. .................... 165/104.33; 257/718; 361/710; 361/709; 361/711
[58] Field of Search ................. 165/104.33, 104.26; 257/719, 718, 715, 714; 361/700, 709, 710, 711

[56] References Cited

U.S. PATENT DOCUMENTS

| | | | |
|---|---|---|---|
| 3,035,419 | 5/1962 | Wigert | 165/104.33 |
| 3,436,603 | 4/1969 | Vogt | 361/711 |
| 3,834,454 | 9/1974 | Gammel et al. | 257/715 X |
| 3,978,518 | 8/1976 | Kessler, Jr. et al. | 165/104.33 |
| 4,019,098 | 4/1977 | McCready et al. | 165/104.33 |
| 4,104,677 | 8/1978 | Kovar et al. | 257/718 |
| 4,126,883 | 11/1978 | Martin | 257/718 |
| 4,204,246 | 5/1980 | Arii et al. | 165/104.33 |
| 4,342,068 | 7/1982 | Kling | 257/718 X |
| 4,449,578 | 5/1984 | Munekawa | 257/715 X |
| 4,628,407 | 12/1986 | August et al. | 257/718 X |
| 4,633,371 | 12/1986 | Nagy et al. | 165/104.33 |
| 5,095,404 | 3/1992 | Chao | 165/104.33 |
| 5,168,919 | 12/1992 | Berenholz et al. | 165/104.33 |
| 5,307,236 | 4/1994 | Rio et al. | 257/718 X |
| 5,313,099 | 5/1994 | Tata et al. | 257/718 X |
| 5,339,214 | 8/1994 | Nelson | 165/104.33 X |
| 5,381,041 | 1/1995 | Harmon | 257/718 |

FOREIGN PATENT DOCUMENTS

| | | | |
|---|---|---|---|
| 5036903 | 3/1980 | Japan | 257/715 |
| 5-288873 | 11/1993 | Japan | 361/709 |

*Primary Examiner*—John Rivell
*Assistant Examiner*—Christopher Atkinson
*Attorney, Agent, or Firm*—Martin Fruitman

[57] ABSTRACT

The apparatus is a cooling device for an integrated circuit chip which includes a heat conductive pad for contact with the top surface of the chip and for attachment to a heat pipe to dispose of the heat. One surface of the pad is flat and contacts the circuit chip while the opposite surface of the pad is attached to a simple cylindrical heat pipe. The pad includes extensions from its sides to which a holding fixture applies force so that the pad is held tightly against the chip. The holding fixture is held on the mounting board by screws while the top of the pad which is attached to the heat pipe protrudes through a hole in the holding fixture. A finned heat exchanger is attached to an end of the heat pipe remote from the conductive pad.

10 Claims, 3 Drawing Sheets

INTEGRATED CIRCUIT COOLING APPARATUS

BACKGROUND OF THE INVENTION

This invention relates generally to heat transfer apparatus, and more specifically to the cooling of an integrated circuit chip.

With the advent of portable, battery operated, personal computers the cooling of integrated circuit chips has become both more critical and more difficult. Desk top computers which are connected to electrical power lines have comparatively unlimited space and power to locate and operate fans for cooling, and they also do not have severe weight restrictions. Portable computers, the so called lap top computers, are, however, very restricted in space, power, and weight, and such restrictions create significant problems in cooling the critical integrated circuits and disposing of the generated heat. At the same time, the number of functions and the power dissipated by individual integrated circuits has significantly increased, so that the problems involved in removing heat have also increased.

Numerous patents have addressed these problems, but most of the devices are very complex and difficult to manufacture so that there are significant possibilities for improvement. Some of the prior art devices integrate the cooling device into a massive assembly which is impractical for use in a lap top computer. Others make no effort to control the contact pressure between the chip and the cooling device, and this can lead to either poor thermal contact or damage to the integrated circuit chip.

SUMMARY OF THE INVENTION

The present invention is an inexpensive cooling apparatus for integrated circuit chips which is of simple, light weight construction, is easily assembled, and provides a consistent prescribed contact force between the thermal transfer surface and the integrated circuit chip.

The cooling apparatus of the present invention is constructed for use with an integrated circuit chip which is surface mounted on a conventional circuit board. It requires no modification of the circuit board other than locating two mounting screws through the board, and the apparatus uses a minimum number of simple parts.

One part is a heat conductive pad held in contact with the top surface of the chip and to which is attached a heat pipe to move the heat away from the chip. One surface of the pad is flat and contacts the circuit chip while the opposite surface of the pad contains a cylindrical groove within which is mounted a simple cylindrical heat pipe. The pad includes extensions projecting from its sides, and the extensions are used as surfaces upon which pressure is exerted to hold the pad against the chip.

The heat conductive pad is held against the chip at a prescribed and repeatable pressure by a flexible holding fixture which is held at an exact distance above the mounting board by cylindrical spacers through which mounting screws are attached to the mounting board. The holding fixture pushes down on the side extensions of the conductive pad while the top of the pad attached to the heat pipe protrudes through a hole in the holding fixture. The combination of the fixed spacing of the holding fixture above the mounting board, as determined by the mounting spacers, along with the inherent drumhead like resiliency of the holding fixture permits the design of a precise contact pressure between the contact surfaces of the conductive pad and the integrated circuit chip. This predetermined and consistent contact pressure assures that the chip will not be damaged from excess pressure upon it, but also guarantees that the heat transfer surfaces will be in intimate and constant contact.

A simple cylindrical heat pipe is attached to the heat conductive pad by being held within a cylindrical groove formed in the heat conductive pad. The groove is located in the surface of the conductive pad directly opposite from the chip contact surface. This location provides excellent heat transfer from the chip to the heat pipe because the heat conduction path is short and has a large cross section.

The heat pipe extends to a remote part of the device in which the chip is installed where access to a heat sink or cooling fluid, such as air moved by natural convection, is available. A heat exchanger, such as one or more fins, can be attached to the remote end of the heat pipe so that the heat from the integrated circuit chip is easily transferred to the ambient air. The heat exchanger may be an additional component or an existing part of the equipment, such as a case or a keyboard.

The present invention thereby furnishes an inexpensive heat dissipation apparatus for integrated circuit chips in lap top computers which does not add significantly to the weight of the lap top and is easy to assemble with accuracy and assurance that the chips will not be harmed by contact pressure.

DETAILED DESCRIPTION OF THE INVENTION

Figure 1:
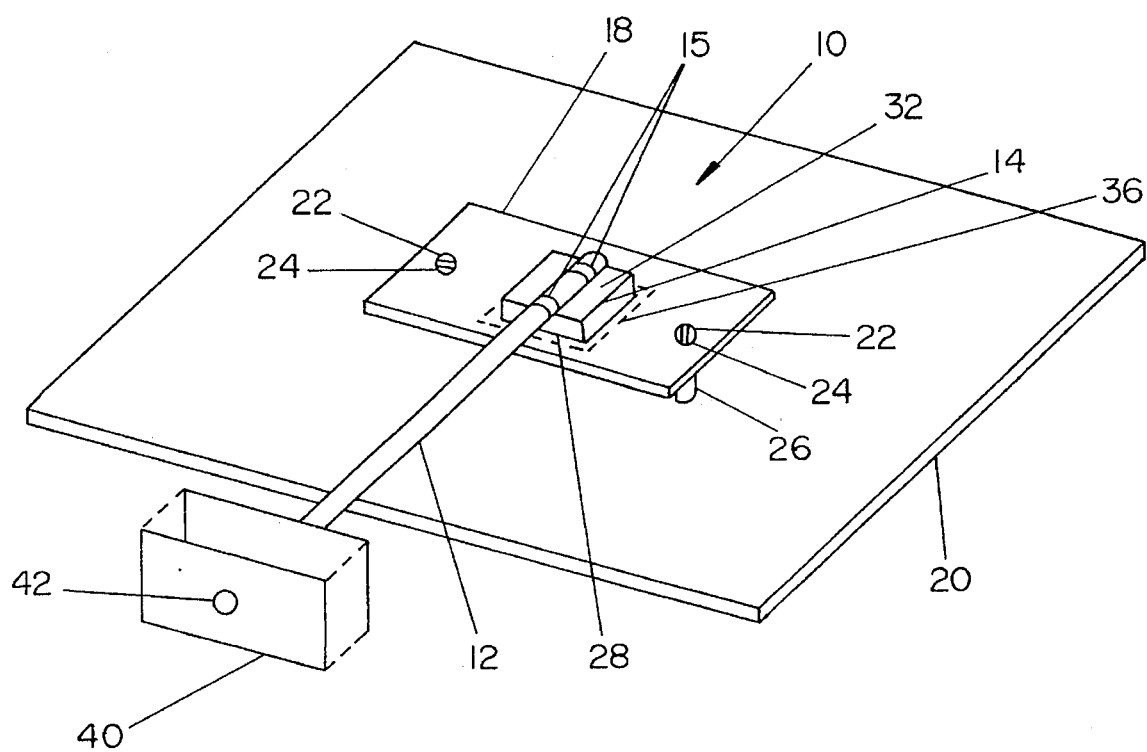
FIG. 1 is a perspective view of the preferred embodiment of the invention.
Figure 2:
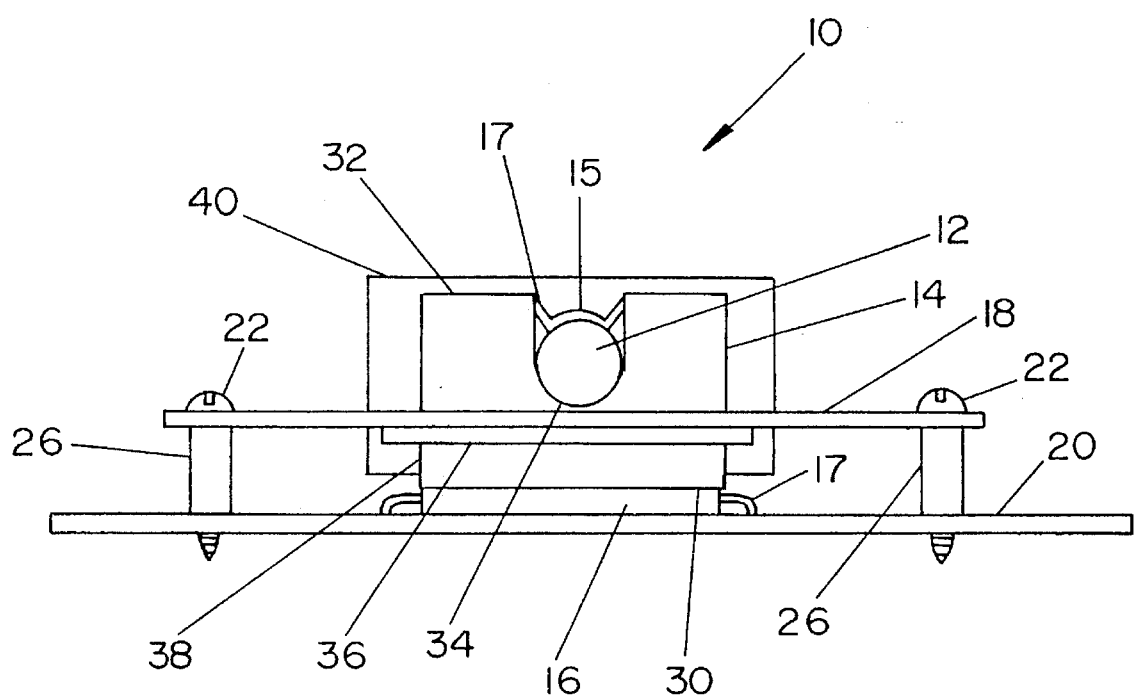
FIG. 2 is an elevation view of the preferred embodiment of the invention.

FIG. 1 is a perspective view and FIG. 2 is a side view of the preferred embodiment of the integrated circuit chip cooling apparatus 10 in which heat pipe 12 is mounted upon heat conductive pad 14 with clips 15, and heat conductive pad 14 is held atop an integrated circuit chip 16 (see FIG. 2) with a prescribed pressure. Integrated circuit chip 16 is attached to mounting board 20 by conventional methods and electrical connections are made by contacts 17.

The pressure with which conductive pad 14 is held against integrated circuit chip 16 is determined by the structure of holding fixture 18. Holding fixture 18 is a sheet structure, and its thickness is selected so that holding fixture 18 is flexible. In the preferred embodiment holding fixture 18 is a rectangular sheet of PVC material which is 0.125 inch thick and is two inches by two inches in size. Holding fixture 18 is attached to mounting board 20 by mounting screws 22 which penetrate holes 24 in mounting board 20.

Holding fixture 18 is raised above mounting board 20 by spacers 26 through which screws 22 fit. Spacers 26 are specifically selected to have heights which result in a prescribed clamping pressure being applied to conductive pad 14 by the flexing of holding fixture 18. The clamping pressure on conductive pad 14 thereby applies a clamping force at the thermal interface 30 between conductive pad 14 and circuit chip 16. In the preferred embodiment spacers 26 are constructed with a height of 0.050 inch yielding a maximum clamping pressure of 25 psi between conductive pad 14 and circuit chip 16.

Holding fixture 18 also includes a clearance hole 28 through which conductive pad 14 is inserted. Clearance hole 28 in holding fixture 18 thereby assures that conductive pad 14 will be properly aligned on top of integrated circuit chip 16.

Conductive pad 14 is constructed with its surface at thermal interface 30 machined flat, so that it will be in continuous contact with integrated circuit chip 16 when holding fixture 18 forces conductive pad 14 against integrated circuit chip 16. Surface 32 of conductive pad 14, the surface opposite from thermal interface 30, includes a groove 34 into which heat pipe 12 fits and is clamped. Conductive pad 14 also includes extensions 36 projecting from its sides 38. Extensions 36 serve as support structures upon which holding fixture 18 rests and applies force to conductive pad 14, thus also capturing conductive pad within hole 28 of holding fixture 18. To function properly extensions 36 need only project from two opposite sides of conductive pad 14, but if heat conductive pad 14 is a square configuration, extensions from all sides makes its orientation less critical.

Heat pipe 12 is a conventional cylindrical heat pipe using water as its internal heat transfer fluid. In the preferred embodiment it is 4 mm (0.157 inch) in diameter and 20 cm (7.87 inches) long, and it has a 0.018 inch thick casing of copper material and an internal wick of sintered copper powder. Such a heat pipe can be produced economically in high quantities, and most importantly, it can be operationally pretested before being attached to conductive pad 14.

Heat pipe 12 can be mounted on conductive pad 14 in several ways. One method is bonding with the use of a heat conductive epoxy. However, for cost considerations, heat pipe 12 can be mounted by a clamp structure such as spring clip 15 shown in FIG. 2. Spring clip 15 is formed with sharp ends 17, so that with heat pipe 12 inserted in groove 34, spring clip 15 need only be pushed in on top of heat pipe 12, and it will lock itself and heat pipe 12 in place by gripping the side walls of groove 34.

Figure 3:
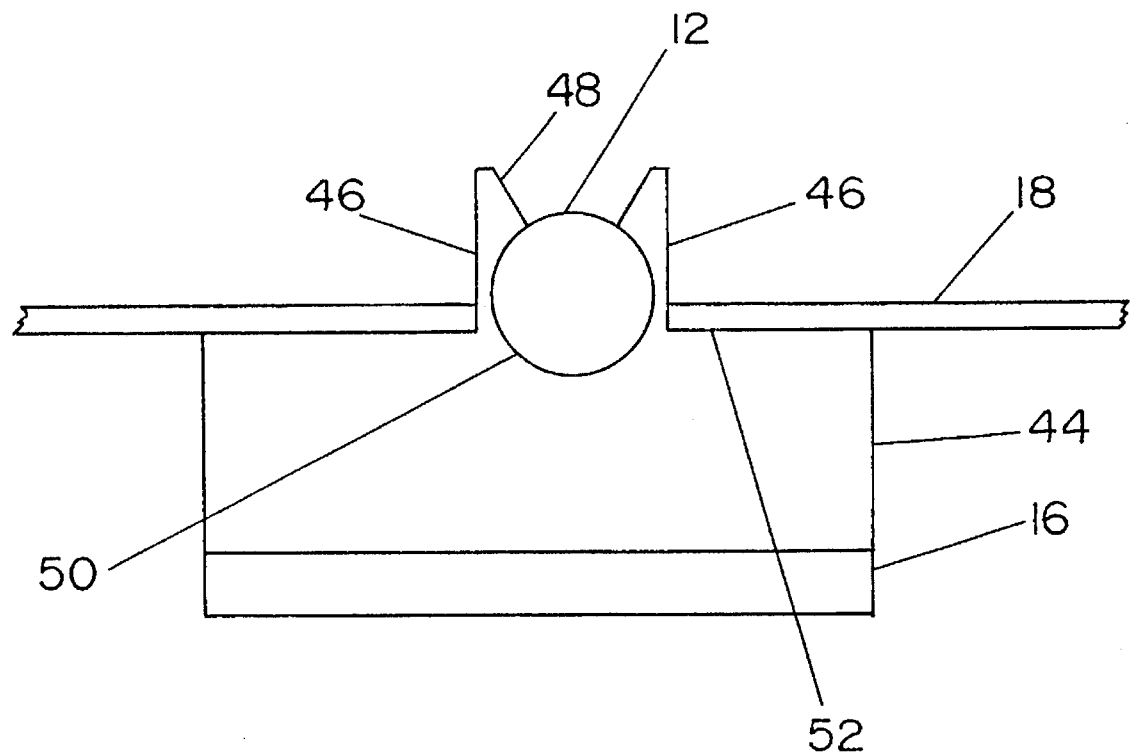
FIG. 3 is an elevation view of an alternate arrangement for mounting a heat pipe on the invention.

FIG. 3 is an elevation view of an alternate arrangement for mounting heat pipe 12 on a specially constructed conductive pad 44. In such a structure, clamping fingers 46 are formed integral with conductive pad 44 and are shaped and spaced apart so that, when heat pipe 12 is pushed down between clamping fingers 46, they will spread to admit heat pipe 12 between the fingers and then spring back toward each other trapping heat pipe 12 between them. The shape of finger ends 48 not only permit heat pipe 12 to spread fingers 46 apart, but also assure that heat pipe 12 will be forced downward tightly against the inside surface of groove 50.

FIG. 3 also demonstrates how extension 36 of FIG. 2 can be replaced with horizontal surface 52 on heat conductive pad 44, as long as there is a surface such as surface 52 upon which holding fixture 18 can apply downward force to conductive pad 44.

Fins 40, shown in FIGS. 1 and 2, are attached to the remote end 42 of heat pipe 12 to remove the heat transferred from integrated circuit chip 16. Fins 40 are constructed conventionally of aluminum or copper and attached to heat pipe 12 by mechanical clamping or bonded with a heat conductive epoxy.

The present invention thereby furnishes an inexpensive and very light weight heat dissipation apparatus for integrated circuit chips. Furthermore, the cooling apparatus of the invention can be assembled by inexperienced personnel with accuracy and the assurance that the chips will not be harmed by contact pressure and yet will have proper contact with the cooling apparatus.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example screws 22 could be replaced with rivets, clip fasteners or other attachment means, and heat conductive pad 14 can be constructed in a different configuration, such as a cylinder, as long as contact surface 30 matches the surface of the integrated circuit chip.

What is claimed as new and for which Letters Patent of the United States are desired to be secured is:

1. An apparatus for cooling an integrated circuit chip comprising:

an integrated circuit chip with a first surface and a second flat surface;

a mounting board to which the integrated circuit chip is attached, with the first surface of the integrated circuit chip in contact with the mounting board and the second surface of the integrated circuit chip more remote from the mounting board than the first surface of the integrated circuit chip;

a heat conductive pad including: a first surface finished to a flat condition with the first surface held in intimate contact with the second surface of the integrated circuit chip; a second surface; and third surfaces located in a plane parallel to the first surface;

a flexible holding fixture applying force against the third surfaces of the heat conductive pad so that the force is directed toward the first surface of the heat conductive pad and compresses the integrated circuit chip between the mounting board and the heat conductive pad;

spacers separating the holding fixture from the mounting board by a distance which determines the force applied to the heat conductive pad by flexing of the holding fixture;

attachment means attached to the mounting board and holding the holding fixture against the spacers and in fixed relationship with the mounting board;

a heat pipe with one part of its casing located in contact with the heat conductive pad and a second part of its casing located in contact with a heat removal means and;

wherein the holding fixture includes a hole through which a portion of the heat conductive pad protrudes.

2. The apparatus of claim 1 wherein the holding fixture includes a hole through which a portion of the heat conductive pad protrudes, the first and second surfaces of the heat conductive pad are located on opposite sides of the holding fixture, and the heat pipe is in contact with the second surface of the heat conductive pad.

3. The apparatus of claim 1 wherein the heat conductive pad is a rectangular prism, the heat pipe is in contact with the second surface which is parallel to the first surface, and the third surfaces are located on extensions which project from at least two opposite sides of the heat conductive pad which are transverse to the first surface.

4. The apparatus of claim 1 wherein the heat pipe is constructed as a cylinder and the second surface of the heat conductive pad includes a groove within which the heat pipe is mounted.

5. The apparatus of claim 1 wherein the holding fixture is a sheet, the spacers are sleeves, the attachment means are screws inserted through the sleeves and through holes in the holding fixture, and the screws are attached to the mounting board.

6. The apparatus of claim 1 wherein the heat removal means is at least one fin attached to the heat pipe.

7. The apparatus of claim 1 wherein the heat pipe is held in contact with the heat conductive pad by clamp means.

8. The apparatus of claim 1 wherein the heat pipe is held within a groove in the heat conductive pad by clamp means.

9. The apparatus of claim 1 wherein the heat pipe is held within a groove in the heat conductive pad by a spring clip which engages the sides of the groove.

10. The apparatus of claim 1 wherein the heat pipe is held in contact with the heat conductive pad by clamp means which is constructed as a part of the heat conductive pad.

\* \* \* \* \*